(12) United States Patent
Wagoner et al.

(10) Patent No.: US 8,711,565 B2
(45) Date of Patent: Apr. 29, 2014

(54) SYSTEM AND METHOD FOR OPERATING AN ELECTRIC POWER CONVERTER

(75) Inventors: Robert Gregory Wagoner, Roanoke, VA (US); Paul Stephen Pate, Troutville, VA (US); Allen Michael Ritter, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 240 days.

(21) Appl. No.: 13/287,757

(22) Filed: Nov. 2, 2011

(65) Prior Publication Data

US 2013/0107601 A1 May 2, 2013

(51) Int. Cl.
*H05K 7/20* (2006.01)
*F28F 7/00* (2006.01)
*H01B 9/06* (2006.01)

(52) U.S. Cl.
USPC .......... 361/700; 361/699; 361/701; 165/80.4; 165/104.33; 174/15.1

(58) Field of Classification Search
None
See application file for complete search history.

(56) References Cited

U.S. PATENT DOCUMENTS

| | | | |
|---|---|---|---|
| 4,161,016 A | 7/1979 | Born et al. | |
| 4,392,153 A | 7/1983 | Glascock, II et al. | |
| 4,712,609 A | 12/1987 | Iversen | |
| 4,758,926 A | 7/1988 | Herrell et al. | |
| 5,270,572 A * | 12/1993 | Nakajima et al. | 257/714 |
| 6,955,063 B2 * | 10/2005 | Adiga et al. | 62/259.2 |
| 7,173,823 B1 | 2/2007 | Rinehart et al. | |
| 7,561,425 B2 * | 7/2009 | Mindock et al. | 361/700 |
| 7,804,689 B2 | 9/2010 | Wang et al. | |
| 7,869,714 B2 * | 1/2011 | Patel et al. | 398/118 |
| 7,905,106 B2 * | 3/2011 | Attlesey | 62/259.2 |
| 7,944,694 B2 * | 5/2011 | Campbell et al. | 361/699 |
| 7,957,145 B2 * | 6/2011 | Suzuki et al. | 361/701 |
| 7,983,040 B2 * | 7/2011 | Campbell et al. | 361/699 |
| 8,014,150 B2 * | 9/2011 | Campbell et al. | 361/700 |
| 8,094,454 B2 * | 1/2012 | Lowry | 361/699 |

OTHER PUBLICATIONS

David L Saums, et al., Vaporizable Dielectric Fluid Cooling of IGBT Power Semiconductors for Vehicle Powertrains, Sep. 2009, 13 pages, Parker Hannifin Corporation, USA.
Jeremy C. Howes, et al., Cooling of an IGBT Drive System with Vaporizable Dielectric Fluid (VDF), 2008, 4 pages, Parker Hannifin Corporation, USA.
David L Saums, Vaporizable Dielectric Fluid Cooling for IGBT Power Semiconductors, 7 pages, Parker Hannifin Corporation, USA.
G. Crawshaw, Phase Change Cooling, 1993, 4 pages, Brush Traction Ltd., The Institution of Electrical Engineers, UK.
L. Marton, Advances in Electronics and Electron Physics, 1976, p. 334, vol. 41, Academic Press, Inc., ISBN 0-12-014541-3.

* cited by examiner

*Primary Examiner* — Boris Chervinsky
(74) *Attorney, Agent, or Firm* — James McGinness; Armstrong Teasdale LLP

(57) ABSTRACT

An electric power converter for a renewable power source includes at least one alternating current (AC) conduit coupled to an external AC power device and at least one direct current (DC) conduit coupled to an external DC power device. The converter also includes at least one immersion structure defining at least one immersion cavity therein and a plurality of semiconductor devices. The semiconductor devices include a substrate positioned within the immersion cavity. The substrate defines a plurality of heat transfer surfaces thereon. The semiconductor devices also include at least one semiconductor die coupled to the substrate, the AC conduit, and the DC conduit. The converter further includes a liquid at least partially filling the immersion cavity such that the semiconductor die is fully immersed in and in direct contact with the liquid. Heat generated in the semiconductor device induces a phase change in the liquid.

18 Claims, 8 Drawing Sheets

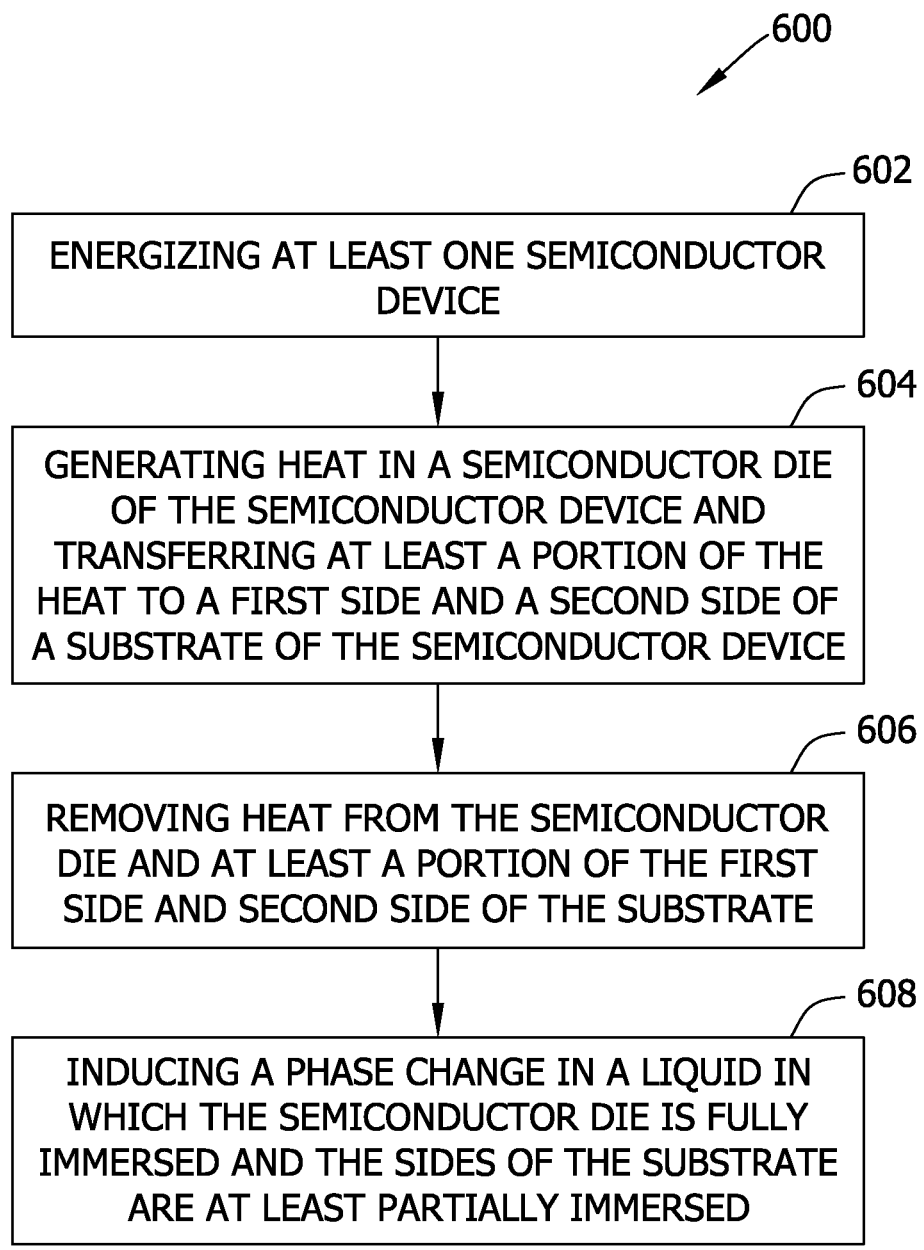

SYSTEM AND METHOD FOR OPERATING AN ELECTRIC POWER CONVERTER

BACKGROUND OF THE INVENTION

The subject matter described herein relates generally to controlling operation of electric power converters, and more specifically, to removing heat from a semiconductor device.

Many known semiconductor devices are used for electric power conversion, e.g., rectifiers and inverters. Most known rectifiers are used for converting alternating current (AC) to direct current (DC) and most know inverters are used for converting DC current to AC current. Some of these rectifiers and inverters are integrated into full power conversion assemblies, i.e., power converters, used in renewable electric power generation facilities that include solar power generation farms and wind turbine farms. However, variables such as solar intensity and wind direction and speed typically produce electric power having varying voltage and/or frequency. Power converters may be coupled between the electric power generation devices in the generation facilities and an electric utility grid. Each power converter receives generated electric power from the associated generation device and transmits electricity having a fixed voltage and frequency for further transmission to the utility grid via a transformer. The transformer may be coupled to a plurality of power converters associated with the electric power generation facility.

Known semiconductor devices include insulated gate bipolar transistors (IGBTs), gate turn-off thyristors (GTOs), silicon-controlled rectifiers (SCRs), metal oxide semiconductor field-effect transistors (MOSFETs), bipolar junction transistors (BJTs), and diodes. Such IGBTs and GTOs generate heat when placed in service. Many known heat removal systems for such semiconductors include a path for heat flow with a high thermal resistance, thereby resulting in a high operating junction temperature for a particular amount of power loss in the semiconductor device. For example, the cooling path for many IGBT modules includes a semiconductor die soldered onto one side of an electrically-isolating substrate, e.g., aluminum nitride, thereby forming an electrical junction thereon. Most of the heat generated by the IGBT is channeled from the junction side of the electrically-isolating substrate, through the substrate, to the opposite side. Many such known substrates include a heat transfer mechanism on the side opposite the junction. This heat transfer mechanism is typically referred to as single-side cooling.

Generally, such electrically-isolating substrates have a relatively high thermal resistance, and this thermal resistance induces the semiconductor die temperature on the junction side of the substrate to be higher than the opposite side of the substrate with the heat transfer mechanism. Also, typically, the thermal path to the heat transfer mechanism includes additional layers of materials that have a high thermal resistance. Such materials include a layer of solder below the electrically-isolating substrate, a layer of copper, a heat sink, and an interface of silicon grease between the IGBT module and the heat sink, wherein these thermal resistances also retard the transfer of heat from the IGBT.

BRIEF DESCRIPTION OF THE INVENTION

In one aspect, an electric power converter for a renewable power source is provided. The electric power converter includes at least one alternating current (AC) conduit coupled to an external AC power device and at least one direct current (DC) conduit coupled to an external DC power device. The converter also includes at least one immersion structure defining at least one immersion cavity therein and a plurality of semiconductor devices. The semiconductor devices include a substrate positioned within the immersion cavity. The substrate defines a plurality of heat transfer surfaces thereon. The semiconductor devices also include at least one semiconductor die coupled to the substrate, the AC conduit, and the DC conduit. The converter further includes a liquid at least partially filling the immersion cavity such that the semiconductor die is fully immersed in and in direct contact with the liquid. Heat generated in the semiconductor device induces a phase change in the liquid.

In another aspect, a heat removal system for at least one semiconductor device is provided. The semiconductor device includes a substrate defining a plurality of heat transfer surfaces thereon and at least one semiconductor die coupled to the substrate. The heat removal system includes at least one immersion structure defining at least one immersion cavity therein. The heat removal system also includes a liquid at least partially filling the immersion cavity such that the semiconductor die is fully immersed in and in direct contact with the liquid. At least a portion of both sides of the heat transfer surfaces on the substrate are also immersed in and in direct contact with the liquid. Heat generated in the semiconductor device induces a phase change in the liquid.

In yet another aspect, a method of operating a heat removal system for an electric power converter is provided. The electric power converter includes at least one semiconductor device and at least one immersion structure defining at least one immersion cavity therein. The semiconductor device is positioned within the immersion cavity and the semiconductor device includes a substrate. The semiconductor device also includes at least one semiconductor die coupled to a first side of the substrate and a second side of the substrate. The immersion cavity is at least partially filled with a liquid such that the semiconductor die is fully immersed in and in direct contact with the liquid and at least a portion of both sides of the substrate are immersed in and in direct contact with the liquid. The method includes energizing at least one semiconductor device. The method also includes generating heat in the semiconductor die and transferring at least a portion of the heat to the first side of the substrate and the second side of the substrate. The method further includes removing heat from the semiconductor die and at least a portion of the first side and second side of the substrate. The method also includes inducing a phase change in the liquid.

BRIEF DESCRIPTION OF THE DRAWINGS

FIG. 8 is a flow chart of an exemplary method of operating a heat removal system for a power converter including the semiconductor devices shown in FIGS. 2 and 4.

DETAILED DESCRIPTION OF THE INVENTION

Figure 1:
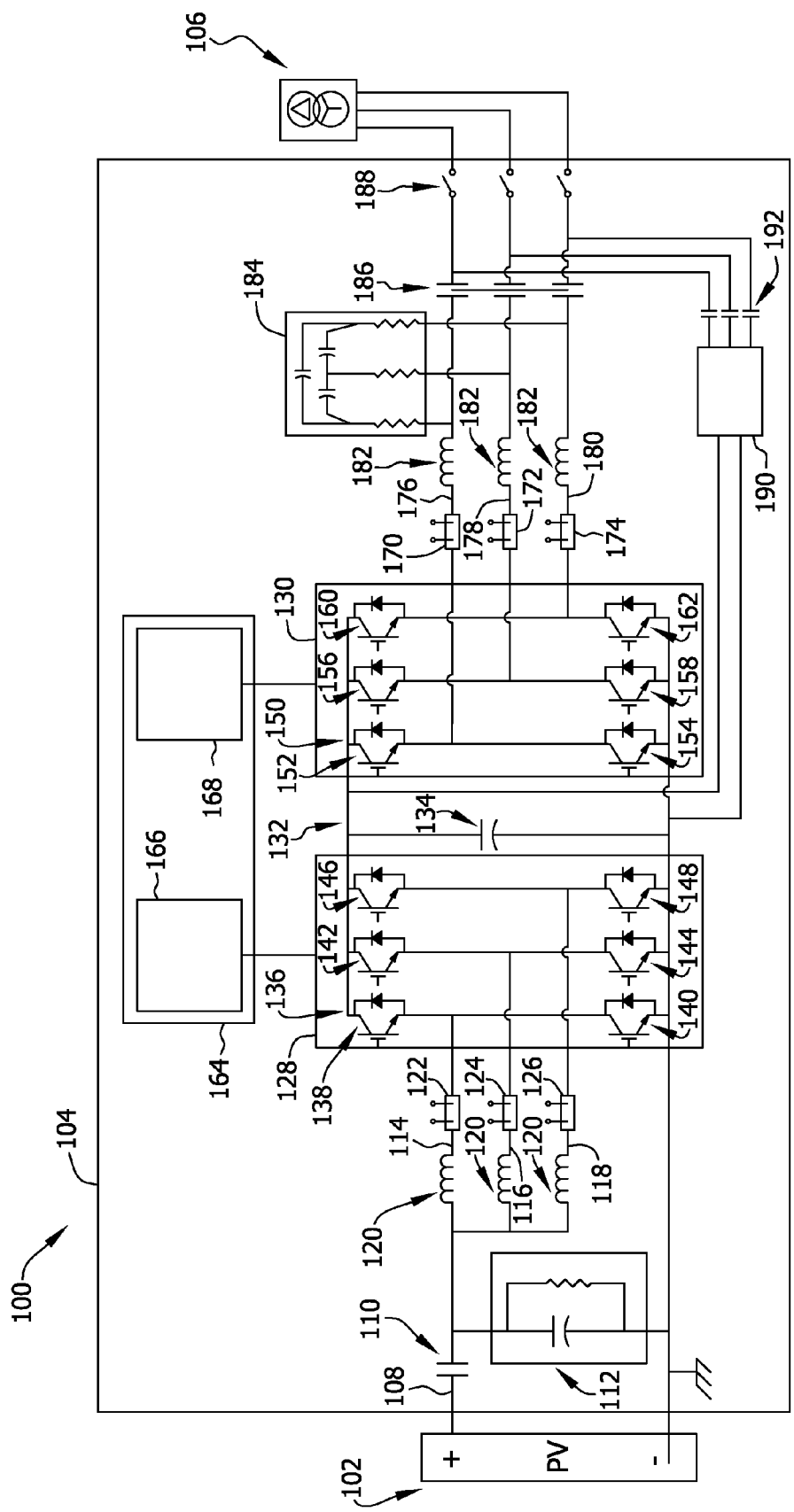
FIG. 1 is a schematic diagram of an exemplary power generation system.

As used herein, the term "blade" is intended to be representative of any device that provides reactive force when in motion relative to a surrounding fluid. As used herein, the term "wind turbine" is intended to be representative of any device that generates rotational energy from wind energy, and more specifically, converts kinetic energy of wind into mechanical energy. As used herein, the term "wind turbine generator" is intended to be representative of any wind turbine that generates electrical power from rotational energy generated from wind energy, and more specifically, converts mechanical energy converted from kinetic energy of wind to electrical power.

Technical effects of the methods, apparatus, and systems described herein include at least one of: (a) increasing a rate of heat transfer from semiconductor devices within an electric power converter by using double-sided heat transfer from surfaces of a substrate; (b) increasing a rate of heat transfer from semiconductor devices within an electric power converter by immersing the devices within a dielectric fluid and facilitating direct cooling and two-phase heat transfer; (c) facilitating an increase in a power conversion capacity of each semiconductor device within an electric power converter due to an increased rate of heat removal from the devices; (d) facilitating a decrease in thermal stresses induced in a semiconductor device by eliminating a plurality of unnecessary layers of materials therein, each layer having a thermal resistance; (e) facilitating an increase in reliability of each semiconductor device within an electric power converter due to decreased thermal stresses induced on the devices; (f) facilitating heat removal from semiconductor devices without relying on forced cooling apparatus, thereby facilitating heat removal regardless of electric power availability to auxiliary cooling equipment, and (g) decreasing the electrical impedance of the power conversion circuit, increasing a switching rate of the devices, and improving the power quality transmitted from the devices due to a reduction of the number and diversity of material layers in the semiconductor devices.

The methods, apparatus, and systems described herein facilitate increasing a power conversion rate and reliability of electric power converters. As described herein, such increases in power conversion rates are facilitated by increasing a rate of heat transfer from semiconductor devices within the electric power converters by using double-sided heat transfer from surfaces of a substrate and immersing the devices within a dielectric fluid to facilitate direct cooling and two-phase heat transfer. Also, as described herein, such increases in reliability are facilitated by eliminating a plurality of unnecessary layers of materials therein, thereby decreasing an overall thermal resistance between the devices and the heat removal fluid. The reduced thermal resistance facilitates improved heat removal from the devices that facilitates decreasing nominal operating temperatures and rate of temperature changes thereof, thereby decreasing a magnitude of thermal stresses induced in the semiconductor devices. Furthermore, at least some of the embodiments of the methods, apparatus, and systems described herein rely on buoyancy forces to facilitate natural circulation. Therefore, heat removal from semiconductor devices is facilitated without relying on forced cooling apparatus, thereby facilitating heat removal regardless of electric power availability to auxiliary cooling equipment. Moreover, reducing the number and diversity of material layers in the semiconductor devices facilitates decreasing the electrical impedance of the power conversion circuit, faster switching of the devices, and improved power quality.

FIG. 1 is a schematic diagram of an exemplary power generation system 100 that includes a plurality of power generation units, such as a plurality of solar panels (not shown) that form at least one solar array 102. Alternatively, power generation system 100 includes any suitable number and type of power generation units, such as a plurality of wind turbines, fuel cells, geothermal generators, hydropower generators, and/or other devices that generate power from renewable and/or non-renewable energy sources.

In the exemplary embodiment, power generation system 100 and/or solar array 102 includes any number of solar panels to facilitate operating power generation system 100 at a desired power output. In one embodiment, power generation system 100 includes a plurality of solar panels and/or solar arrays 102 coupled together in a series-parallel configuration to facilitate generating a desired current and/or voltage output from power generation system 100. Solar panels include, in one embodiment, one or more of a photovoltaic panel, a solar thermal collector, or any other device that converts solar energy to electrical energy. In the exemplary embodiment, each solar panel is a photovoltaic panel that generates a substantially direct current (DC) power as a result of solar energy striking solar panels.

In the exemplary embodiment, solar array 102 is coupled to a power conversion assembly 104, i.e., a power converter 104, that converts the DC power to alternating current (AC) power. The AC power is transmitted to an electrical distribution network 106, or "grid." Power converter 104, in the exemplary embodiment, adjusts an amplitude of the voltage and/or current of the converted AC power to an amplitude suitable for electrical distribution network 106, and provides AC power at a frequency and a phase that are substantially equal to the frequency and phase of electrical distribution network 106. Moreover, in the exemplary embodiment, power converter 104 provides three phase AC power to electrical distribution network 106. Alternatively, power converter 104 provides single phase AC power or any other number of phases of AC power to electrical distribution network 106.

DC power generated by solar array 102, in the exemplary embodiment, is transmitted through a converter conductor 108 coupled to power converter 104. In the exemplary embodiment, a protection device 110 electrically disconnects solar array 102 from power converter 104, for example, if an error or a fault occurs within power generation system 100. As used herein, the terms "disconnect" and "decouple" are used interchangeably, and the terms "connect" and "couple" are used interchangeably. Current protection device 110 is a circuit breaker, a fuse, a contactor, and/or any other device that enables solar array 102 to be controllably disconnected from power converter 104. A DC filter 112 is coupled to converter conductor 108 for use in filtering an input voltage and/or current received from solar array 102.

Converter conductor 108, in the exemplary embodiment, is coupled to a first input conductor 114, a second input conductor 116, and a third input conductor 118 such that the input current is split between first, second, and third input conductors 114, 116, and 118. Alternatively, the input current may be transmitted to a single conductor, such as converter conductor 108, and/or to any other number of conductors that enables power generation system 100 to function as described herein. At least one boost inductor 120 is coupled to each of first input conductor 114, second input conductor 116, and/or third input conductor 118. Boost inductors 120 facilitate filtering the input voltage and/or current received from solar array 102. In addition, at least a portion of the energy received from solar array 102 is temporarily stored within each boost inductor 120.

In the exemplary embodiment, a first input current sensor 122 is coupled to first input conductor 114, a second input current sensor 124 is coupled to second input conductor 116, and a third input current sensor 126 is coupled to third input conductor 118. First, second, and third input current sensors 122, 124, and 126 measure the current flowing through first, second, and third input conductors 114, 116, and 118, respectively.

In the exemplary embodiment, power converter 104 includes a DC to DC, or "boost," converter 128 and an inverter 130 coupled together by a DC bus 132. Boost converter 128, in the exemplary embodiment, is coupled to, and receives DC power from, solar array 102 through first, second, and third input conductors 114, 116, and 118. Moreover, boost converter 128 adjusts the voltage and/or current amplitude of the DC power received. In the exemplary embodiment, inverter 130 is a DC-AC inverter that converts DC power received from boost converter 128 into AC power for transmission to electrical distribution network 106. Alternatively, for those embodiments that include electric power generation devices such as, without limitation, wind turbines, that generate a variable AC frequency and voltage, boost converter 128 may be replaced with, or supplemented with, an electrical rectification device such that power converter 104 would be a full power conversion assembly. Moreover, in the exemplary embodiment, DC bus 132 includes at least one capacitor 134. Alternatively, DC bus 132 includes a plurality of capacitors 134 and/or any other electrical power storage devices that enable power converter 104 to function as described herein. As current is transmitted through power converter 104, a voltage is generated across DC bus 132 and energy is stored within capacitors 134.

Boost converter 128, in the exemplary embodiment, includes two converter switches 136 coupled together in serial arrangement for each phase of electrical power that power converter 104 produces. In the exemplary embodiment, converter switches 136 are semiconductor devices, e.g., insulated gate bipolar transistors (IGBTs). Alternatively, converter switches 136 are any other suitable transistor or any other suitable switching device, including, without limitation, gate turn-off thyristors (GTOs). Moreover, each pair of converter switches 136 for each phase is coupled in parallel with each pair of converter switches 136 for each other phase. As such, for a three phase power converter 104, boost converter 128 includes a first converter switch 138 coupled in series with a second converter switch 140, a third converter switch 142 coupled in series with a fourth converter switch 144, and a fifth converter switch 146 coupled in series with a sixth converter switch 148. First and second converter switches 138 and 140 are coupled in parallel with third and fourth converter switches 142 and 144, and with fifth and sixth converter switches 146 and 148. Alternatively, boost converter 128 may include any suitable number of converter switches 136 arranged in any suitable configuration.

Inverter 130, in the exemplary embodiment, includes two inverter switches 150 coupled together in serial arrangement for each phase of electrical power that power converter 104 produces. In the exemplary embodiment, inverter switches 150 are semiconductor devices, e.g., IGBTs. Alternatively, inverter switches 150 are any other suitable transistor or any other suitable switching device, including, without limitation, GTOs. Moreover, each pair of inverter switches 150 for each phase is coupled in parallel with each pair of inverter switches 150 for each other phase. As such, for a three phase power converter 104, inverter 130 includes a first inverter switch 152 coupled in series with a second inverter switch 154, a third inverter switch 156 coupled in series with a fourth inverter switch 158, and a fifth inverter switch 160 coupled in series with a sixth inverter switch 162. First and second inverter switches 152 and 154 are coupled in parallel with third and fourth inverter switches 156 and 158, and with fifth and sixth inverter switches 160 and 162. Alternatively, inverter 130 may include any suitable number of inverter switches 150 arranged in any suitable configuration.

Power converter 104 includes a control system 164 that includes a converter controller 166 and an inverter controller 168. Converter controller 166 is coupled to, and controls an operation of, boost converter 128. More specifically, in the exemplary embodiment, converter controller 166 operates boost converter 128 to maximize the power received from solar array 102. Inverter controller 168 is coupled to, and controls the operation of, inverter 130. More specifically, in the exemplary embodiment, inverter controller 168 operates inverter 130 to regulate the voltage across DC bus 132 and/or to adjust the voltage, current, phase, frequency, and/or any other characteristic of the power output from inverter 130 to substantially match the characteristics of electrical distribution network 106.

In the exemplary embodiment control system 164, converter controller 166, and/or inverter controller 168 include and/or are implemented by at least one processor. As used herein, the processor includes any suitable programmable circuit such as, without limitation, one or more systems and microcontrollers, microprocessors, reduced instruction set circuits (RISC), application specific integrated circuits (ASIC), programmable logic circuits (PLC), field programmable gate arrays (FPGA), and/or any other circuit capable of executing the functions described herein. The above examples are exemplary only, and thus are not intended to limit in any way the definition and/or meaning of the term "processor." In addition, control system 164, converter controller 166, and/or inverter controller 168 include at least one memory device (not shown) that stores computer-executable instructions and data, such as operating data, parameters, setpoints, threshold values, and/or any other data that enables control system 164 to function as described herein.

Converter controller 166, in the exemplary embodiment, receives current measurements from first input current sensor 122, second input current sensor 124, and/or third input current sensor 126. Moreover, converter controller 166 receives measurements of a voltage of first input conductor 114, second input conductor 116, and/or third input conductor 118 from a plurality of input voltage sensors (not shown). Inverter controller 168, in the exemplary embodiment, receives current measurements from a first output current sensor 170, a second output current sensor 172, and/or a third output current sensor 174. Moreover, inverter controller 168 receives measurements of a voltage output from inverter 130 from a plurality of output voltage sensors (not shown). In the exemplary embodiment, converter controller 166 and/or inverter controller 168 receive voltage measurements of the voltage of DC bus 132 from a DC bus voltage sensor (not shown).

In the exemplary embodiment, inverter 130 is coupled to electrical distribution network 106 by a first output conductor 176, a second output conductor 178, and a third output conductor 180. Moreover, in the exemplary embodiment, inverter 130 provides a first phase of AC power to electrical distribution network 106 through first output conductor 176, a second phase of AC power to electrical distribution network 106 through second output conductor 178, and a third phase of AC power to electrical distribution network 106 through third output conductor 180. First output current sensor 170 is coupled to first output conductor 176 for measuring the current flowing through first output conductor 176. Second output current sensor 172 is coupled to second output conductor 178 for measuring the current flowing through second output conductor 178, and third output current sensor 174 is coupled to third output conductor 180 for measuring the current flowing through third output conductor 180.

At least one inductor 182 is coupled to each of first output conductor 176, second output conductor 178, and/or third output conductor 180. Inductors 182 facilitate filtering the output voltage and/or current received from inverter 130. Moreover, in the exemplary embodiment, an AC filter 184 is coupled to first output conductor 176, second output conductor 178, and/or third output conductor 180 for use in filtering an output voltage and/or current received from conductors 176, 178, and 180.

In the exemplary embodiment, at least one contactor 186 and/or at least one disconnect switch 188 are coupled to first output conductor 176, second output conductor 178, and/or third output conductor 180. Contactors 186 and disconnect switches 188 electrically disconnect inverter 130 from electrical distribution network 106, for example, if an error or a fault occurs within power generation system 100. Moreover, in the exemplary embodiment, protection device 110, contactors 186 and disconnect switches 188 are controlled by control system 164. Alternatively, protection device 110, contactors 186 and/or disconnect switches 188 are controlled by any other system that enables power converter 104 to function as described herein.

Power converter 104 also includes a bus charger 190 that is coupled to first output conductor 176, second output conductor 178, third output conductor 180, and to DC bus 132. In the exemplary embodiment, at least one charger contactor 192 is coupled to bus charger 190 for use in electrically disconnecting bus charger 190 from first output conductor 176, second output conductor 178, and/or third output conductor 180. Moreover, in the exemplary embodiment, bus charger 190 and/or charger contactors 192 are controlled by control system 164 for use in charging DC bus 132 to a predetermined voltage.

During operation, in the exemplary embodiment, solar array 102 generates DC power and transmits the DC power to boost converter 128. Converter controller 166 controls a switching of converter switches 136 to adjust an output of boost converter 128. More specifically, in the exemplary embodiment, converter controller 166 controls the switching of converter switches 136 to adjust the voltage and/or current received from solar array 102 such that the power received from solar array 102 is increased and/or maximized.

Inverter controller 168, in the exemplary embodiment, controls a switching of inverter switches 150 to adjust an output of inverter 130. More specifically, in the exemplary embodiment, inverter controller 168 uses a suitable control algorithm, such as pulse width modulation (PWM) and/or any other control algorithm, to transform the DC power received from boost converter 128 into three phase AC power signals. Alternatively, inverter controller 168 causes inverter 130 to transform the DC power into a single phase AC power signal or any other signal that enables power converter 104 to function as described herein.

In the exemplary embodiment, each phase of the AC power is filtered by AC filter 184, and the filtered three phase AC power is transmitted to electrical distribution network 106. In the exemplary embodiment, three phase AC power is also transmitted from electrical distribution network 106 to DC bus 132 by bus charger 190. In one embodiment, bus charger 190 uses the AC power to charge DC bus 132 to a suitable voltage amplitude, for example, during a startup and/or a shutdown sequence of power converter 104.

Alternative embodiments of power generation system 100 include other power generation devices that generate AC power, e.g., wind turbines, in contrast to the DC power generated by solar array 102. Generally, a wind turbine includes a rotor that includes a rotatable hub assembly having multiple blades. The blades transform wind energy into a mechanical rotational torque that drives one or more generators via the rotor. Variable speed operation of the wind turbine facilitates enhanced capture of energy when compared to a constant speed operation of the wind turbine. However, variable speed operation of the wind turbine produces electric power having varying voltage and/or frequency. More specifically, the frequency of the electric power generated by the variable speed wind turbine is proportional to the speed of rotation of the rotor. Typically, full power conversion assemblies, i.e., alternative embodiments of power converter 104 that include an electrical rectification device, may be coupled between the wind turbine's electric generator and electrical distribution network 106. The full power conversion assembly receives the electric power from the wind turbine generator and transmits electricity having a fixed voltage and frequency for further transmission to electrical distribution network 106.

In these alternative embodiments, the full power conversion assemblies include rectifiers for converting the AC generated by the wind turbine generator to DC power. Also, such full power conversion assemblies include an inverter substantially similar to inverter 130 coupled to the rectifier by a DC bus network to convert the DC power to AC power. Further, the rectifiers and inverters in such full power conversion assemblies includes a plurality of semiconductor devices similar to converter switches 136 within boost converter 128 and inverter switches 150 within inverter 130. Moreover, such rectifiers, inverters 130, and booster converters 128 are fully scalable for electric power conversion applications of any size, any voltage, any number of phases, and any frequencies.

In some alternative embodiments of wind turbines, doubly-fed induction generators (DFIGs) are used. Such configurations include DFIG converters that include two three-phase AC-DC converters coupled by a DC link. One AC-DC converter is connected to the grid and stator of the generator, and the other AC-DC converter is connected to the rotor of the generator. If the generator rotor is being turned at a speed slower than the synchronous speed, the DFIG converter will excite the rotor with reactive power. The rotor will then appear to be turning at a synchronous speed with respect to the stator and the stator will make the desired (synchronous frequency) power. If the generator rotor is being turned at synchronous speed, the DFIG converter will excite the rotor with DC power and the stator will generate the desired (synchronous frequency) power. If the generator rotor is being turned at a speed faster than the synchronous speed, the DFIG converter will excite the rotor with reactive power while at the same time extracting real power from the rotor. The rotor will then appear to be turning at a synchronous speed with respect to the stator and the stator will generate the desired (synchronous frequency) power. The frequency of the power extracted from the rotor will be converted to the synchronous frequency and added to the power generated by the stator.

Figure 2:
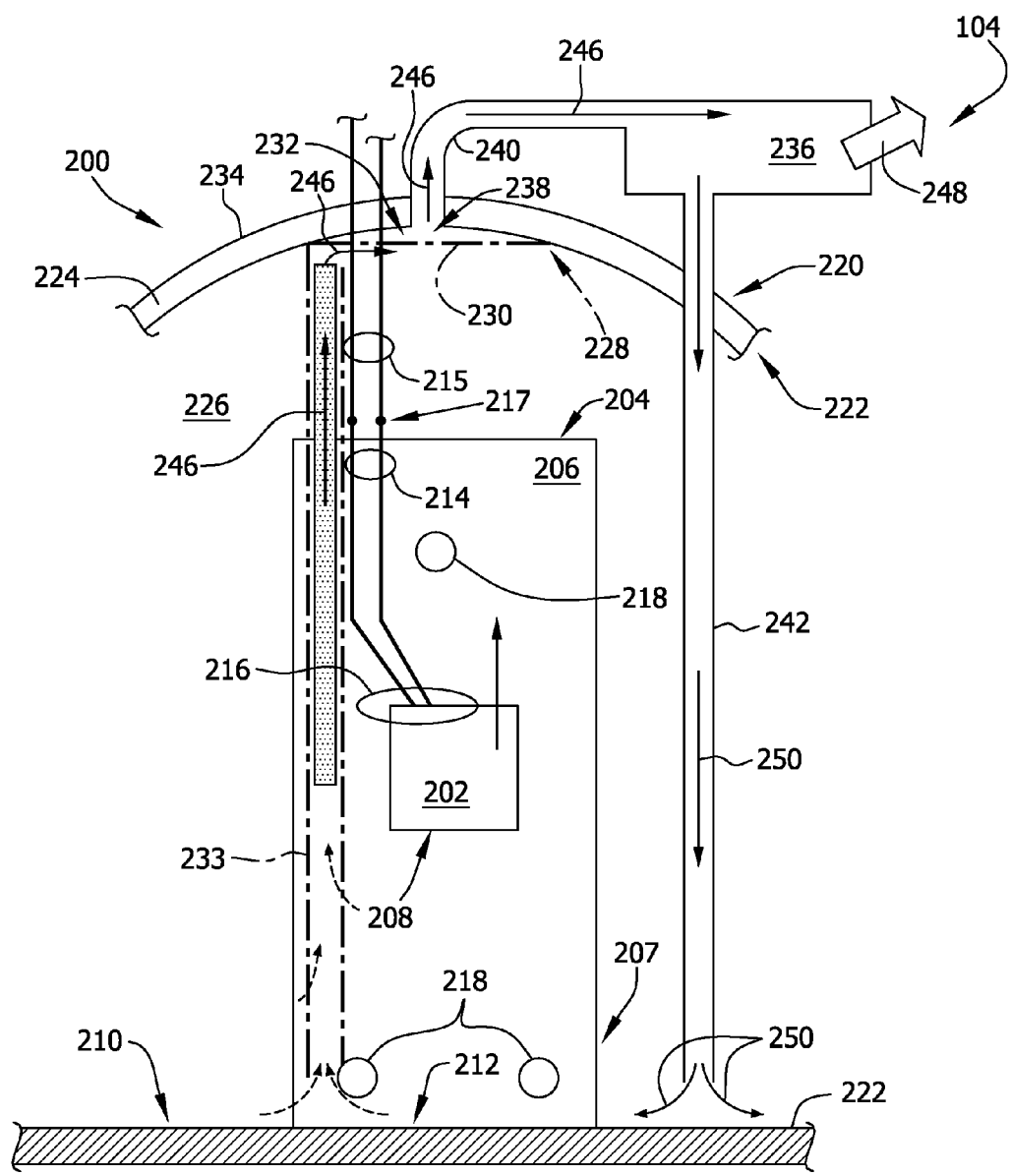
FIG. 2 is a schematic diagram of an exemplary semiconductor device including a single semiconductor die coupled to a substrate.

FIG. 2 is a schematic diagram of an exemplary semiconductor device 200 including a single semiconductor die 202 coupled to a substrate 204. In the exemplary embodiment, semiconductor device 200 is similar to converter switches 136 within boost converter 128 and inverter switches 150 within inverter 130 (all shown in FIG. 1), i.e., semiconductor device 200 is an IGBT. Semiconductor die 202 is primarily formed from silicon. However, semiconductor die 202 may be any die that enables operation of semiconductor device 200 as described herein. Semiconductor die 202 is soldered onto a first side, or surface 206 of a sheet of substrate 204. Substrate 204 is formed from a material that is electrically-conductive and thermally conductive, e.g., a metal, such as copper, thereby forming an electrical junction 208 thereon. Alternatively, substrate 204 is formed from any electrically-conductive and thermally conductive material that enables operation of semiconductor device 200 as described herein. Substrate 204 also defines a second side, or surface, 207 that is opposite to surface 206.

Substrate 204 is coupled to a floor 210 to form a bottom electrical connection 212, i.e., an IGBT collector contact. Bottom electrical connection 212 facilitates securely mounting semiconductor die 202 and holding it in the desired position within power converter 104. Alternatively, any method of securing substrate 204 that enables operation of semiconductor device 200 is used. A plurality of bond wires 214 are coupled to die 202 to define top electrical connections 216, i.e., IGBT gate and emitter contacts. Bond wires 214 are terminated and coupled to standard wiring 215 at fixed mountings and connections 217. Alternatively, instead of semiconductor devices that use three electrical connections, wherein one of those connections is for device control, e.g., IGBTs, some embodiments use semiconductor devices that have two electrical connections, i.e., an anode and a cathode without device control, e.g., diodes. Also, since control connections do not generate as much heat as the power connections, such control connections need not be immersed and may be coupled to substrate 204 at a location separate from the power connections. Moreover, in the exemplary embodiment, substrate 204 defines a plurality of openings 218 that may be used for mounting and/or making electrical connections.

In the exemplary embodiment, power converter 104 includes a heat removal system 220 that includes at least one immersion structure 222. Immersion structure 222 includes at least a portion of floor 210 and a ceiling 224. Immersion structure 222 also includes a least one wall (not shown) Immersion structure 222 defines an immersion cavity 226 that is at least partially filled with a liquid 228. Ceiling 224 extends over a surface 230 of liquid 228 to define a void 232 between surface 230 and ceiling 224. Sufficient liquid 228 is channeled into immersion cavity 226 to position surface 230 such that semiconductor die 202 is fully immersed in and in direct contact with liquid 228. At least a portion of bond wires 214 are similarly immersed. Liquid 228 is any substance, or combination of substances, that change phase from liquid to vapor when a surface temperature of die 202, substrate 204, and/or bond wires 214 attain a predetermined temperature due to heat generated therein, including, without limitation, refrigerant R-134A.

In some alternative embodiments, heat removal system 220 includes at least one vapor channeling conduit 233 (only one shown in phantom in FIG. 2) that includes, without exception, a heat pipe or a heat pin. Vapor channeling conduit 233 is positioned proximate semiconductor die 202 and bond wires 214, wherein die 202 and bond wires 214 transmit electric power and generate the majority of the heat within power converter 104. In some of these alternative embodiments, vapor channeling conduit 233 is a solid conduit extending from a position proximate to floor 210 to a position proximate ceiling 224. Such solid conduits facilitate a phase change of the liquid therein to vapor. In other alternative embodiments, vapor channeling conduit 233 is fabricated from a porous material that receives at least some of the vapor bubbles generated by die 202 and bond wires 214.

Moreover, in the exemplary embodiment, heat removal system 220 includes an outer ceiling surface 234, wherein heat in liquid 228 is transferred to ceiling 224, and the heat is transferred from power converter 104 via surface 234. In some embodiments, heat removal system 220 also includes at least one external heat exchange device 236 (only one shown in FIG. 2) coupled in flow communication with immersion cavity 226 via an opening 238 defined in ceiling 224, an immersion cavity exit conduit 240, and at least one liquid return conduit 242, e.g., a wick (only one shown in FIG. 2). Ceiling 224 is shaped and opening 238 is positioned to facilitate vapor collection within void 232 and vapor channeling into conduit 240 for removal from immersion cavity 226. External heat exchange device 236 facilitates assisting ceiling 224 with heat transfer from immersion cavity 226 and is air-cooled to facilitate transfer of heat from power converter 104. Alternatively, any means of transferring heat from heat exchange device 236 is used, including, without limitation, either an open or closed cooling water circuit.

Further, in the exemplary embodiment, heat removal system 220 includes semiconductor device 200, wherein the size, orientation, means of positioning, and materials of device 200 are predetermined to facilitate heat removal therefrom. Device 200 is positioned so that it does not interfere with a cooling flow path (discussed further below). Moreover, in the exemplary embodiment, one semiconductor device 200 is in one immersion cavity 226. Alternatively, any number of devices 200 may be positioned in any immersion cavity 226 that enables operation of heat removal system 220 as described herein, including, without limitation, all devices 220 of a power converter 104. Multiple semiconductor devices 200 may be mounted into a single immersion cavity 226 with common cooling liquid 228 if the phase-change cooling liquid selected has a high electrical resistance, i.e., a dielectric fluid such as refrigerant R-134A. Also, alternatively, power converter 104 may include any number of immersion cavities that enables operation of heat removal system 220 as described herein. In some embodiments, substrate 204 may have features to enhance mounting and cooling, such as holes 218, bends, and/or fins (both not shown).

Figure 3:
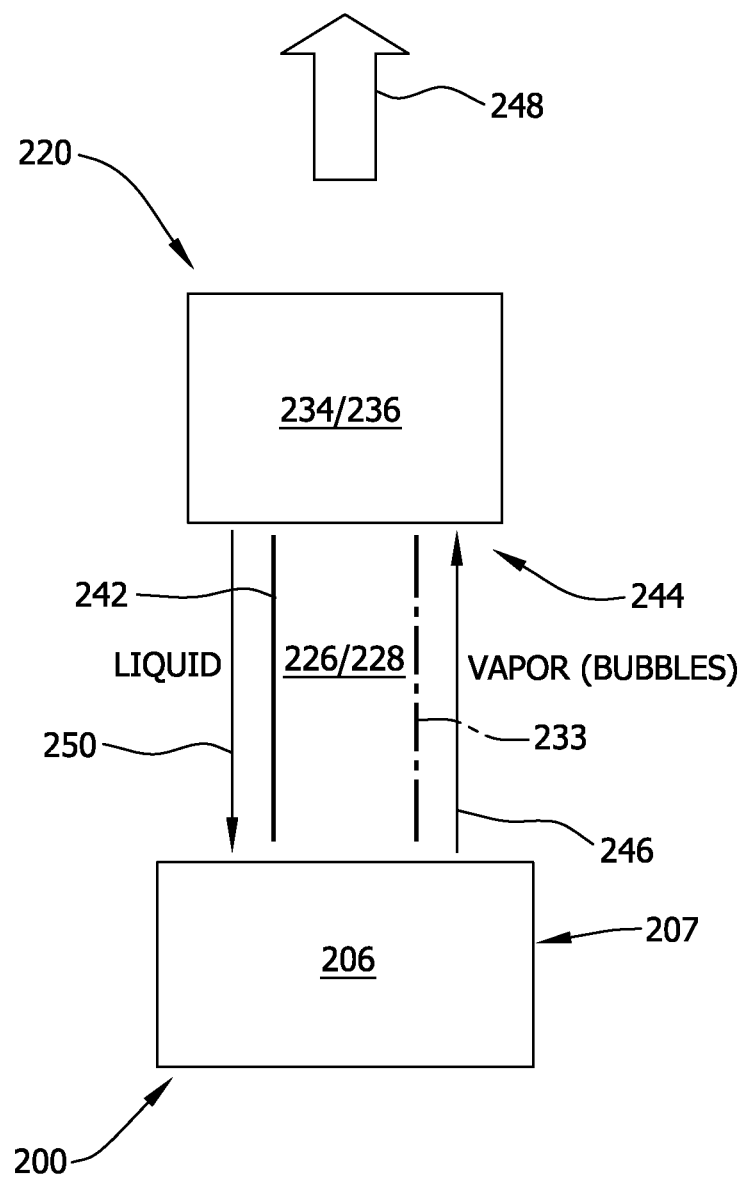
FIG. 3 is a schematic diagram of a natural circulation flow using the semiconductor device shown in FIG. 2.

FIG. 3 is a schematic diagram of a natural circulation flow 244 using semiconductor device 200. Referring to FIG. 2 with FIG. 3, in operation, semiconductor device 200 is energized. As die 202 and bond wires 214 of device 200 generate heat, the temperatures of die 202, surfaces 206 and 207, and bond wires 214 increase, thereby transferring heat to liquid 228, including double-sided heat transfer from surfaces 206 and 207. Once the initial warm-up is complete, semiconductor device 200 and heat removal system 220 are substantially isothermal. Specifically, upon liquid 228 attaining a predetermined temperature associated with a predetermined semiconductor die operating temperature, i.e., the boiling point of the liquid, liquid 228 boils and changes phase to a plurality of vapor bubbles to form a vapor stream 246 in liquid 228. The lower density of vapor stream 246 as compared to liquid 228 facilitates buoyancy-driven natural circulation flow 244. In at least some embodiments, at least one vapor channeling conduit 233 facilitates channeling vapor stream 246 upward. Vapor channeling conduit 233 may also facilitate formation of vapor stream 246 at a hot interface within conduit 233, which is typically at a very low pressure, and liquid 228 in contact with the thermally conductive solid surface of conduit 233 turns into a vapor by absorbing heat from that surface.

Vapor 246 collects in void 232 and some of vapor 246 transfers heat 248 through ceiling 224 (shown in FIG. 3), wherein vapor 246 changes phase from vapor 246 to liquid 250 when the latent heat is removed. In some embodiments, some of vapor 246 enters external heat exchange device 236 by opening 238 and immersion cavity exit conduit 240. Heat 248 is removed from vapor 246 and transferred to air in the surrounding environment. Vapor 246 condenses as the latent heat is removed, thereby reforming as a liquid 250. Liquid 250 is channeled to a lower portion of immersion cavity 226 via liquid return conduit 242 through capillary action and/or buoyancy action, thereby completing natural circulation flow 244.

Figure 4:
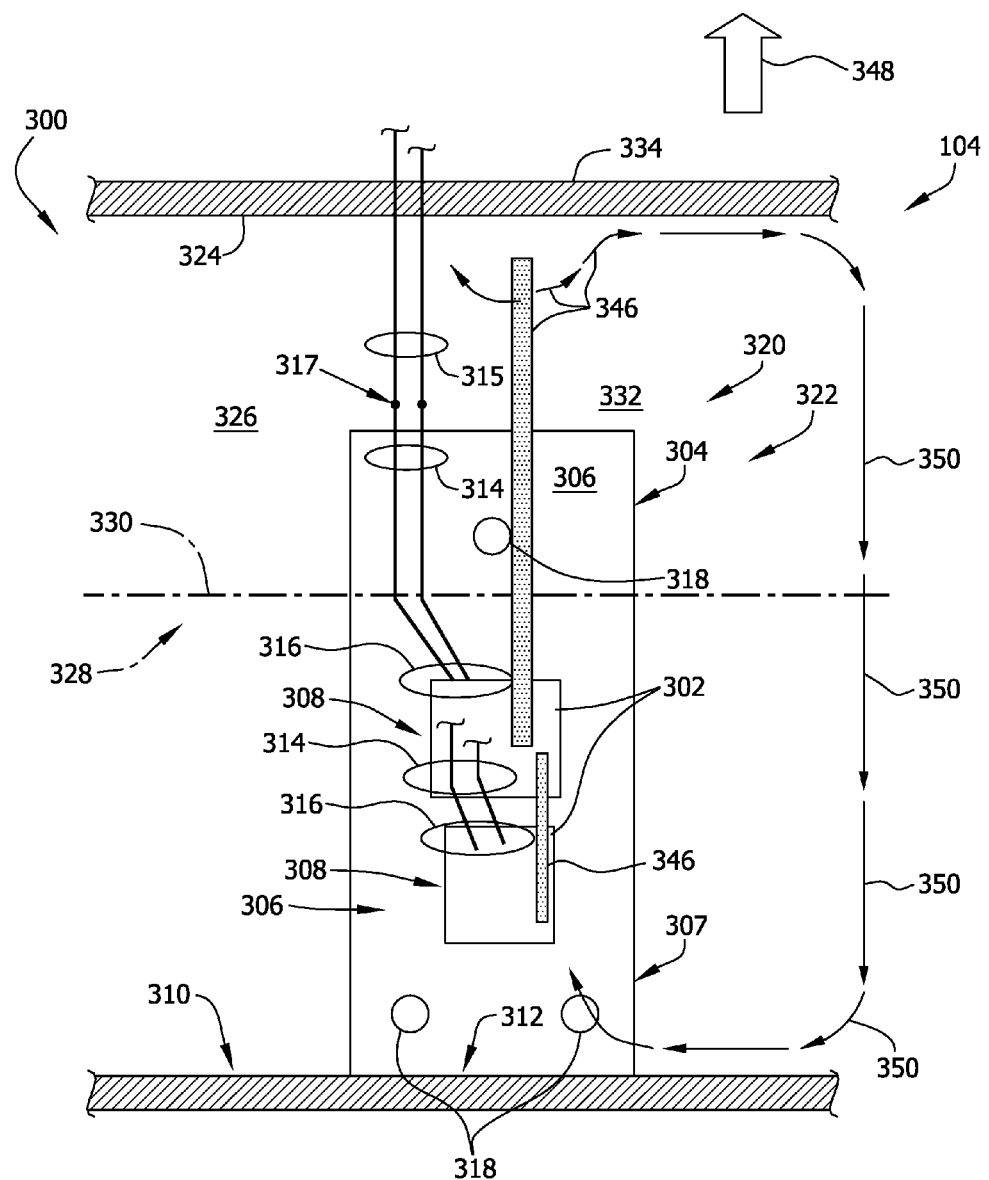
FIG. 4 is a schematic diagram of an exemplary semiconductor device including a plurality of semiconductor dies coupled to the substrate.

FIG. 4 is a schematic diagram of an exemplary semiconductor device 300 including a plurality of semiconductor dies 302 coupled to a substrate 304. In the exemplary embodiment, semiconductor device 300 is similar to converter switches 136 within boost converter 128 and inverter switches 150 within inverter 130 (all shown in FIG. 1), i.e., semiconductor device 300 is an IGBT. Semiconductor die 302 is primarily formed from silicon. However, semiconductor die 302 may be any die that enables operation of semiconductor device 300 as described herein. Semiconductor dies 302 are soldered onto a first side, or surface 306 of a sheet of substrate 304. Substrate 304 is formed from a material that is electrically-conductive and thermally conductive, e.g., a metal, such as copper, thereby forming an electrical junction 308 thereon. Alternatively, substrate 304 is formed from any electrically-conductive and thermally conductive material that enables operation of semiconductor device 300 as described herein. Substrate 304 also defines a second side, or surface, 307 that is opposite to surface 306.

Substrate 304 is coupled to a floor 310 to form a bottom electrical connection 312, i.e., an IGBT collector contact. Bottom electrical connection 312 facilitates securely mounting semiconductor dies 302 and holding them in the desired position within power converter 104. Alternatively, any method of securing substrate 304 that enables operation of semiconductor device 300 is used. A plurality of bond wires 314 are coupled to each die 302 to define top electrical connections 316, i.e., IGBT gate and emitter contacts. Bond wires 314 are terminated and coupled to standard wiring 315 at fixed mountings and connections 317. Alternatively, instead of semiconductor devices that use three electrical connections, e.g., IGBTs, some embodiments use semiconductor devices that have two electrical connections, i.e., an anode and a cathode, e.g., diodes. Also, since control connections do not generate as much heat as the power connections, such control connections need not be immersed and may be coupled to substrate 304 at a location separate from the power connections. Moreover, in the exemplary embodiment, substrate 304 defines a plurality of openings 318 that may be used for mounting and/or making electrical connections.

In the exemplary embodiment, power converter 104 includes a heat removal system 320 that includes at least one immersion structure 322. Immersion structure 322 includes at least a portion of floor 310 and a ceiling 324. Immersion structure 322 also includes a least one wall (not shown) Immersion structure 322 defines an immersion cavity 326 that is at least partially filled with a liquid 328. Ceiling 324 extends over a surface 330 of liquid 328 to define a void 332 between surface 330 and ceiling 324. Sufficient liquid 328 is channeled into immersion cavity 326 to position surface 330 such that semiconductor dies 302 are fully immersed in and in direct contact with liquid 328. At least a portion of bond wires 314 are similarly immersed. Liquid 328 is any substance, or combination of substances, that change phase from liquid to vapor when a surface temperature of dies 302 and/or substrate 304 attain a predetermined temperature due to heat generated therein, including, without limitation, refrigerant R-134A.

Also, in the exemplary embodiment, heat removal system 320 includes outer ceiling surface 334, wherein heat in liquid 328 is transferred to ceiling 324, and the heat is transferred from power converter 104 via surface 334. In contrast to heat removal system 220 (shown in FIG. 2), heat removal system 320 does not include a device similar to external heat exchange device 236 (shown in FIG. 2). However, alternative embodiments of system 320 may include such devices. Also, in contrast to heat removal system 220, heat removal system 320 does not include devices similar to vapor channeling conduit 233 and liquid return conduit 242 (both shown in FIG. 2). However, alternative embodiments of system 320 may include such conduits. Ceiling 324 is shaped to facilitate vapor collection within void 332. Outer ceiling surface 334 is air-cooled to facilitate transfer of heat from power converter 104. Alternatively, any means of transferring heat from surface 334 is used, including, without limitation, either an open or a closed cooling water circuit.

Further, in the exemplary embodiment, heat removal system 320 includes semiconductor device 300, wherein the size, orientation, means of positioning, and materials of device 300 are predetermined to facilitate heat removal therefrom. Device 300 is positioned so that it does not interfere with a cooling flow path (discussed further below). Moreover, in the exemplary embodiment, one semiconductor device 300 is in one immersion cavity 326. Alternatively, any number of devices 300 may be positioned in any immersion cavity 326 that enables operation of heat removal system 320 as described herein, including, without limitation, all devices 320 of a power converter 104. Multiple semiconductor devices 300 may be mounted into a single immersion cavity 326 with common cooling liquid 328 if the phase-change cooling liquid is selected to have a high electrical resistance, i.e., a dielectric fluid, such as refrigerant R-134A. Also, alternatively, power converter 104 may include any number of immersion cavities that enables operation of heat removal system 320 as described herein. In some embodiments, substrate 304 may have features to enhance mounting and cooling, such as holes 318, bends, and/or fins (both not shown).

Figure 5:
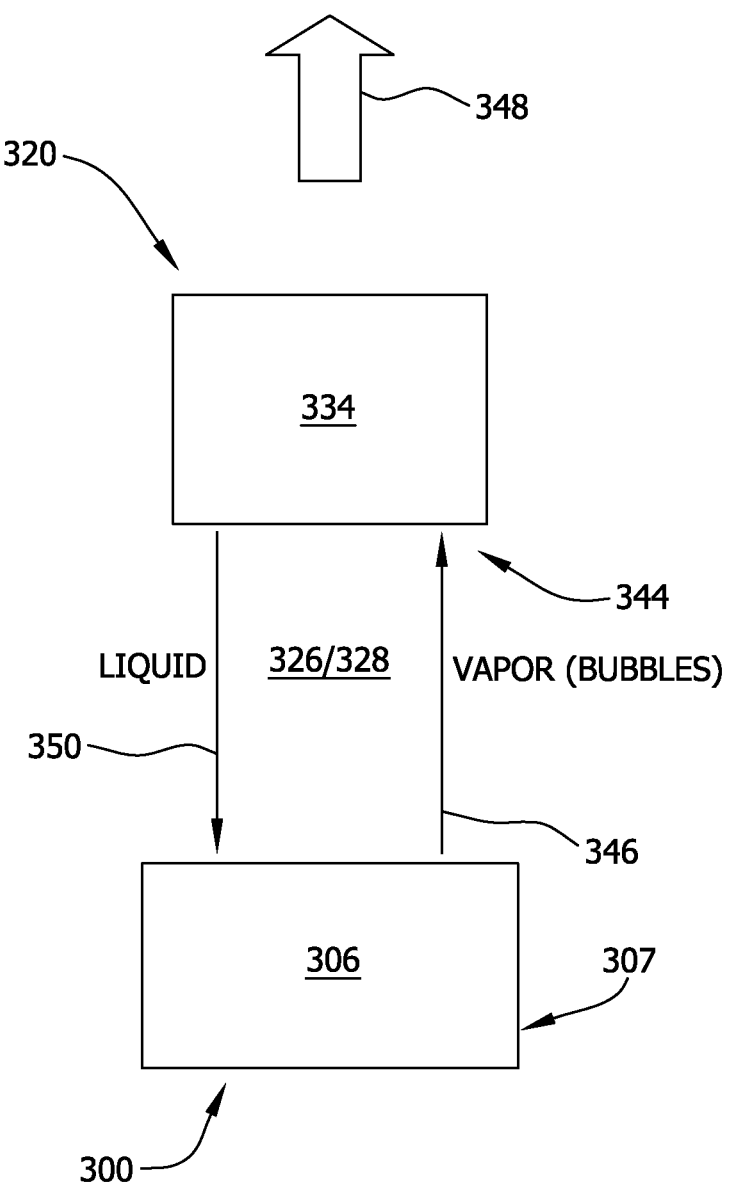
FIG. 5 is a schematic diagram of a natural circulation flow using the semiconductor device shown in FIG. 4.

FIG. 5 is a schematic diagram of a natural circulation flow 344 using semiconductor device 300. Referring to FIG. 4 with FIG. 5, in operation, semiconductor device 300 is energized. As die 302 and bond wires 314 of device 300 generate heat, the temperatures of die 302, surfaces 306 and 307, and bond wires 314 increase, thereby transferring heat to liquid 328, including double-sided heat transfer from surfaces 306 and 307. Once the initial warm-up is complete, semiconductor device 300 and heat removal system 320 are substantially isothermal. Specifically, upon liquid 328 attaining a predetermined temperature associated with a predetermined semiconductor die operating temperature, i.e., the boiling point of the liquid, liquid 328 boils and changes phase to a vapor to form a vapor stream 346 in liquid 328. The lower density of vapor stream 346 as compared to liquid 328 facilitates buoyancy-driven natural circulation flow 344. Vapor stream 346 collects in void 332 and contacts ceiling 324. Latent heat 348 is removed from vapor stream 346 and transferred to air in the surrounding environment. Vapor stream 346 condenses as the latent heat is removed and vapor stream 346 reforms as a liquid 350. Liquid 350 is channeled to a lower portion of immersion cavity 326 due to the greater density of cooled liquid as compared to warmer liquid 328 and vapor stream 346, thereby completing natural circulation flow 344.

Figure 6:
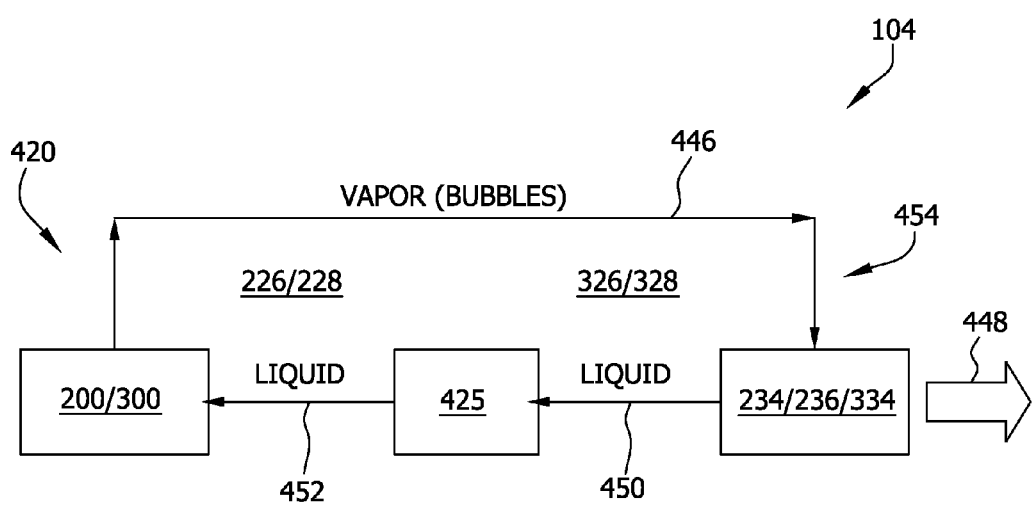
FIG. 6 is a schematic diagram of an exemplary alternative heat removal system that may be used with the semiconductor devices shown in FIGS. 2 and 4.

FIG. 6 is a schematic diagram of an exemplary alternative heat removal system 420 that may be used with semiconductor devices 200 and 300. In this alternative embodiment, system 420 includes a forced flow device 425 that includes, without limitation, a pump and a compressor. Forced flow device 425 is positioned in flow communication with, and between, at least one of outer surfaces 234 and 334 and/or external heat exchange device 236 and semiconductor devices 200 and 300. Forced flow device 425 pulls a suction on liquid 450 from surfaces/device 234/236/334 and increases the pressure of liquid 450 to form a pressurized liquid 452, thereby inducing a forced circulation flow 454 within immersion cavity 226/326. Pressurized liquid 452 induces flow of liquid 228/328 across semiconductor device 200/300, wherein vapor bubbles 446 are formed as described above. Forced circulation flow 454 induces a movement of vapor bubbles 446 toward surfaces/device 234/236/334, wherein heat 448 is removed and vapor bubbles 446 condense to form liquid 450.

In this alternative embodiment, forced flow device 425 is positioned in a lower portion of immersion cavity 226/326 to facilitate providing device 425 with sufficient net positive suction head to reduce a potential of cavitation and to at least partially use the force of buoyancy to induce flow through natural circulation to assist forced circulation flow 454. Therefore, in the event of a loss of electrical power to forced flow device 425, natural circulation will facilitate at least partial coolant flow within immersion cavity 226/326, thereby facilitating at least partial heat removal from semiconductor devices 200/300. Furthermore, in other embodiments, forced flow device 425 is maintained in a standby condition until conditions within immersion cavity 226/326 warrant additional heat transfer from semiconductor devices 200/300. Under such conditions, forced flow device 425 may be used to facilitate the additional heat removal, thereby enhancing and/or supplementing natural circulation flow and facilitating an increase in the power conversion capacity of power converter 104.

Figure 7:
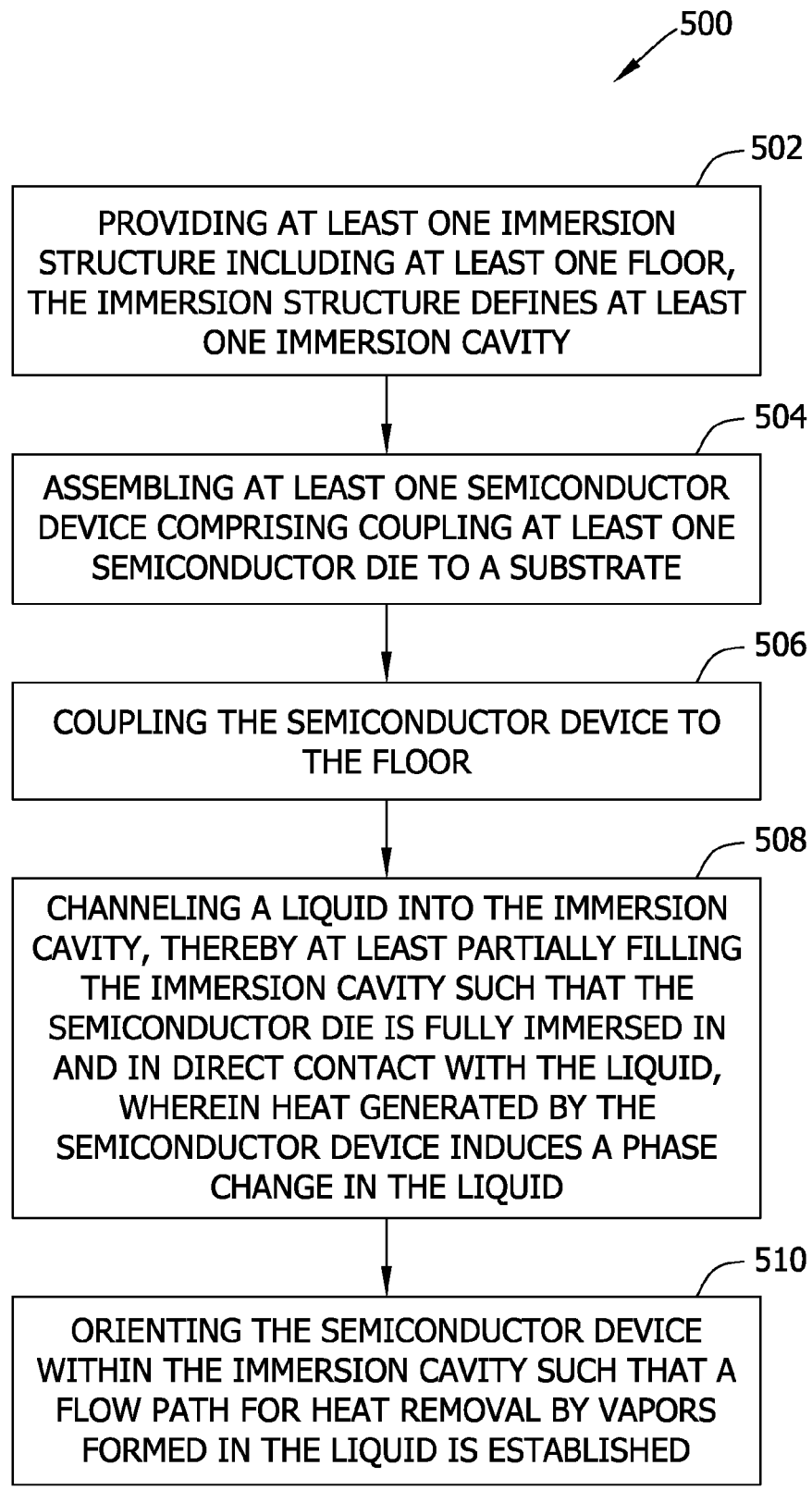
FIG. 7 is a flow chart of an exemplary method of assembling a heat removal system for a power converter including the semiconductor devices shown in FIGS. 2 and 4.

FIG. 7 is a flow chart of an exemplary method 500 of assembling heat removal systems 200 and 300 (shown in FIGS. 2 and 4, respectively) for electric power converter 104 (shown in FIGS. 1, 2, and 4) including semiconductor devices 200 and 300 (shown in FIGS. 2 and 4, respectively). In the exemplary embodiment, at least one immersion structure 222/322 (shown in FIGS. 2 and 4, respectively) including at least one floor 210/310 (shown in FIGS. 2 and 4, respectively) is provided 502. Immersion structure 222/322 defines at least one immersion cavity 226/326 (shown in FIGS. 2 and 4, respectively). At least one semiconductor device 200/300 is assembled 504 including coupling at least one semiconductor die 202/302 (shown in FIGS. 2 and 4, respectively) to a substrate 204/304 (shown in FIGS. 2 and 4, respectively).

Also, in the exemplary embodiment, semiconductor device 200/300 is coupled 506 to floor 210/310. Liquid 228/328 (shown in FIGS. 2 and 4, respectively) is channeled 508 into immersion cavity 226/326, thereby at least partially filling immersion cavity 226/326 such that semiconductor die 202/302 is fully immersed in and in direct contact with liquid 228/328, wherein heat generated by semiconductor device 200/300 induces a phase change in liquid 228/328. Semiconductor device 200/300 is oriented 510 within immersion cavity 226/326 such that flow path 244/344/454 (shown in FIGS. 2 and 4, respectively) for heat removal by vapors 246/346/446 (shown in FIGS. 2 and 4, respectively) formed in liquid 228/328 is established.

FIG. 8 is a flow chart of an exemplary method 600 of operating heat removal systems 200 and 300 (shown in FIGS. 2 and 4, respectively) for electric power converter 104 (shown in FIGS. 1, 2, and 4) including semiconductor devices 200 and 300 (shown in FIGS. 2 and 4, respectively). Semiconductor devices 200/300 include at least one semiconductor die 202/302 (shown in FIGS. 2 and 4, respectively) coupled to a first side 206/306 (shown in FIGS. 2 and 4, respectively) of substrate 204/304 (shown in FIGS. 2 and 4, respectively) of semiconductor devices 200/300. Semiconductor devices 200/300 also include a second side 207/307 (shown in FIGS. 2 and 4, respectively) opposing first side 206/306. Semiconductor devices 200/300 are positioned within at least one immersion structure 222/322 (shown in FIGS. 2 and 4, respectively) defining at least one immersion cavity 226/326 (shown in FIGS. 2 and 4, respectively) therein Immersion cavity 226/336 is at least partially filled with liquid 228/328 (shown in FIGS. 2 and 4, respectively) such that semiconductor die 202/302 is fully immersed in and in direct contact with liquid 228/328 and at least a portion of both sides 206/207/306/307 of substrate 204/304 are immersed in and in direct contact with liquid 228/328.

In the exemplary embodiment, at least one semiconductor device 200/300 is energized 602. Heat 248/348 (shown in FIGS. 2 and 4, respectively) is generated 604 in semiconductor die 202/302 and at least a portion of heat 248/348 is transferred to first side 206/306 of substrate 204/304 and second side 207/307 of substrate 204/304. Heat 248/348 is removed 606 from semiconductor die 202/302 and at least a portion of first side 206/306 and second side 207/307 of substrate 204/304. A phase change is induced 608 in liquid 228/328.

The above-described embodiments facilitate increasing a power conversion rate and reliability of electric power converters. Specifically, the heat removal apparatus and systems described herein use double-sided heat transfer from surfaces of a substrate and immersion of the devices within a dielectric fluid to facilitate direct cooling and two-phase heat transfer. Also, specifically, a plurality of unnecessary layers of materials between the heat generating portions of semiconductor devices and the heat transfer surfaces are eliminated, thereby decreasing an overall thermal resistance between the devices and the heat removal fluid. Such improved heat removal from the semiconductor devices increases effective power conversion rates and device reliability by decreasing nominal operating temperatures and rate of temperature changes thereof, thereby decreasing a magnitude of thermal stresses induced in the semiconductor devices. Furthermore, at least some of the embodiments of the methods, apparatus, and systems described herein rely on buoyancy forces to facilitate natural circulation. Therefore, heat removal from semiconductor devices is facilitated without relying on forced cooling apparatus, thereby facilitating heat removal regardless of electric power availability to auxiliary cooling equipment. Moreover, reducing the number and diversity of material layers in the semiconductor devices facilitates decreasing the electrical impedance of the power conversion circuit, faster switching of the devices, and improved power quality.

Exemplary embodiments of an electric power generation facility, electric power conversion apparatus, and semiconductor device heat removal systems, and methods for assembling the same are described above in detail. The methods, facilities, systems, and apparatus are not limited to the specific embodiments described herein, but rather, components of the facilities, systems, and apparatus, and/or steps of the methods may be utilized independently and separately from other components and/or steps described herein. For example, the power converters, heat removal systems, and methods may also be used in combination with other power conversion apparatus and methods, and are not limited to practice with only the power systems as described herein. Rather, the exemplary embodiment can be implemented and utilized in connection with many other electric power conversion applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electric power converter for a renewable power source comprising:
    at least one alternating current (AC) conduit coupled to an external AC power device;
    at least one direct current (DC) conduit coupled to an external DC power device;
    at least one immersion structure defining at least one immersion cavity therein;
    a plurality of semiconductor devices comprising:
        a substrate positioned within said immersion cavity, said substrate defines a plurality of heat transfer surfaces thereon; and,
        at least one semiconductor die coupled to said substrate, said AC conduit, and said DC conduit;
    a heat removal system coupled said at least one immersion structure, said heat removal system comprising:
        a vapor channel conduit positioned within said immersion cavity;
        a liquid return conduit positioned within said immersion cavity; and,
        an immersion cavity exit conduit coupled in flow communication to said vapor channel conduit and said liquid return conduit; and,
    a liquid at least partially filling said immersion cavity such that said semiconductor die is fully immersed in and in direct contact with said liquid, wherein heat generated in said semiconductor device induces a phase change in said liquid to a vapor to induce a natural, unforced circulation flow of said vapor,
        said vapor conduit channel configured to channel said vapor to said immersion cavity exit conduit, said immersion cavity exit conduit configured to induce another phase change of the vapor back to said liquid, and said liquid return conduit configured to channel said liquid to said immersion cavity.

2. An electric power converter in accordance with claim 1, wherein said substrate comprises at least one sheet formed from a material that is thermally conductive and electrically conductive.

3. An electric power converter in accordance with claim 1, wherein said immersion structure comprises an upper heat exchange surface extending over said immersion cavity.

4. An electric power converter in accordance with claim 3, wherein said liquid partially fills said immersion cavity such that a void is defined between a surface of said liquid and said upper heat exchange surface.

5. An electric power converter in accordance with claim 3, wherein said upper heat exchange surface comprises a ceiling of said immersion structure extending over said surface of said liquid and partially defining said immersion cavity.

6. An electric power converter in accordance with 1, wherein said immersion structure further comprises:
    a ceiling configured to cooperate with a surface of said liquid to collect vapors generated from the phase change of the liquid; and,
    at least one heat exchange surface positioned external to said immersion cavity and in flow communication with said immersion cavity and an ambient air.

7. A heat removal system for at least one semiconductor device, the semiconductor device including a substrate defining a plurality of heat transfer surfaces thereon and at least one semiconductor die coupled to the substrate, said heat removal system comprising:
    at least one immersion structure defining at least one immersion cavity therein;
    a vapor channel conduit positioned within said immersion cavity;
    a liquid return conduit positioned within said immersion cavtity; and,
    an immersion cavity exit conduit coupled in flow communication to said vapor channel conduit and said liquid return conduit; and,
    a liquid at least partially filling said immersion cavity such that the semiconductor die is fully immersed in and in direct contact with said liquid and at least a portion of both sides of the heat transfer surfaces on the substrate are immersed in and in direct contact with said liquid, wherein heat generated in said semiconductor device induces a phase change in said liquid to a vapor to induce a natural, unforced circulation flow of said vapor, wherein said vapor conduit channel configured to channel said vapor to said immersion cavity exit conduit, said immersion cavity exit conduit configured to induce another phase change of the vapor back to said liquid, and said liquid return conduit configured to channel said liquid to said immersion cavity.

8. A system in accordance with claim 7, wherein said immersion structure comprises an upper heat exchange surface extending over said immersion cavity.

9. A system in accordance with claim 8, wherein said liquid partially fills said immersion cavity such that a void is defined between a surface of said liquid and said upper heat exchange surface.

10. A system in accordance with claim 9, wherein said upper heat exchange surface comprises a ceiling of said immersion structure extending over said surface of said liquid and partially defining said immersion cavity.

11. A system in accordance with claim 7, wherein said immersion structure further comprises:
    a ceiling configured to cooperate with a surface of said liquid to collect vapors generated from the phase change of the liquid; and,
    at least one heat exchange surface positioned external to said immersion cavity and in flow communication with said immersion cavity and an ambient air.

12. A method of operating a heat removal system for an electric power converter including at least one semiconductor device and at least one immersion structure defining at least one immersion cavity therein, the semiconductor device positioned within the immersion cavity, the semiconductor device includes a substrate and at least one semiconductor die coupled to a first side of the substrate and a second side of the substrate, the immersion cavity is at least partially filled with a liquid such that the semiconductor die is fully immersed in and in direct contact with the liquid and at least a portion of both sides of the substrate are immersed in and in direct contact with the liquid, said method comprising:

energizing the semiconductor device;

generating heat in the semiconductor die and transferring at least a portion of the heat to the first side and the second side of the substrate; and, removing heat from the semiconductor die and at least a portion of the first side and second side of the substrate comprising inducing a phase change in the liquid to a vapor;

inducing a natural, unforced circulation flow of the vapor within a vapor channeling conduit;

removing heat from the vapor comprising inducing another phase change in the vapor back to the liquid; and channeling the liquid through a liquid return conduit and into the immersion cavity.

13. A method in accordance with claim 12, wherein inducing a phase change in the liquid comprises inducing a natural circulation flow within the immersion cavity.

14. A method in accordance with claim 12, wherein inducing a phase change in the liquid comprises channeling a plurality of vapor bubbles away from each of the semiconductor die and both sides of the substrate.

15. A method in accordance with claim 12, wherein inducing a phase change in the liquid comprises channeling a plurality of vapor bubbles to at least one heat transfer device configured to remove heat from the electric power converter.

16. A method in accordance with claim 12, wherein inducing a phase change in the liquid comprises:

channeling a plurality of vapor bubbles away from the semiconductor die and at least a portion of the first side and second side of the substrate through a conduit; and, channeling a liquid formed from condensed vapor bubbles from a heat transfer device to a region near a floor of the immersion structure through a conduit.

17. A method in accordance with claim 16, wherein channeling a liquid formed from condensed vapor bubbles from a heat transfer device comprises at least one of:

collecting the vapor bubbles proximate to a ceiling of the immersion structure;

channeling the vapor bubbles to form a vapor stream; and, channeling the vapor stream through a heat exchanger positioned external to the immersion cavity.

18. A method in accordance with claim 12, further comprising inducing forced fluid flow within the immersion cavity, thereby at least one of at least partially replacing and at least partially enhancing natural circulation flow.

* * * * *